(12) United States Patent
Seki et al.

(10) Patent No.: US 12,408,551 B2
(45) Date of Patent: Sep. 2, 2025

(54) THERMOELECTRIC CONVERSION MODULE

(71) Applicant: LINTEC CORPORATION, Tokyo (JP)

(72) Inventors: Yuta Seki, Kawasaki (JP); Kunihisa Kato, Warabi (JP); Wataru Morita, Saitama (JP); Katsuhiko Horigome, Shiraoka (JP); Mutsumi Masumoto, Beppu (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 18/034,442

(22) PCT Filed: Oct. 28, 2021

(86) PCT No.: PCT/JP2021/039750
§ 371 (c)(1),
(2) Date: Apr. 28, 2023

(87) PCT Pub. No.: WO2022/092177
PCT Pub. Date: May 5, 2022

(65) Prior Publication Data
US 2023/0380288 A1    Nov. 23, 2023

(30) Foreign Application Priority Data

Oct. 30, 2020  (JP) .................................. 2020-182610
Oct. 30, 2020  (JP) .................................. 2020-182614
Mar. 31, 2021  (JP) .................................. 2021-062199

(51) Int. Cl.
*H10N 10/17*    (2023.01)
(52) U.S. Cl.
CPC .................................. *H10N 10/17* (2023.02)

(58) Field of Classification Search
CPC ...... H10N 10/17; H10N 10/01; H10N 10/856; H10N 10/857; H02N 11/00
See application file for complete search history.

(56) References Cited

U.S. PATENT DOCUMENTS 4,459,428  A  *  7/1984  Chou ..................... H10N 10/17
                                                           136/211
2018/0130938  A1    5/2018  Kohtani et al.
(Continued)

FOREIGN PATENT DOCUMENTS

JP    2001102643 A    4/2001
JP    2001352107 A    12/2001
(Continued)

OTHER PUBLICATIONS

English machine translation of KR20160028697A (Year: 2025).*
(Continued)

*Primary Examiner* — Angelo Trivisonno
(74) *Attorney, Agent, or Firm* — Element IP, PLC

(57) ABSTRACT

Provided is a thin thermoelectric conversion module provided with no support base material and including: an integrated body including an insulator configured to fill a gap defined by a chip of a P-type thermoelectric conversion material and a chip of an N-type thermoelectric conversion material, the chips being alternately arranged and spaced apart from each other; a common first electrode provided on one surface of the integrated body and joining one surface of the chip of the P-type thermoelectric conversion material and one surface of the chip of the N-type thermoelectric conversion material; and a common second electrode provided on another surface of the integrated body, facing the first electrode, and joining another surface of the chip of the N-type thermoelectric conversion material and another surface of the chip of the P-type thermoelectric conversion material, in which the first electrode and the second elec-
(Continued)

trode provide electrically serial connection between the chip of the P-type thermoelectric conversion material and the chip of the N-type thermoelectric conversion material, and both surfaces of the thermoelectric conversion module are provided with no base material.

9 Claims, 6 Drawing Sheets

(56) References Cited

U.S. PATENT DOCUMENTS

| | | | |
|---|---|---|---|
| 2018/0233648 A1* | 8/2018 | Cho | H10N 10/17 |
| 2019/0378967 A1 | 12/2019 | Morita et al. | |
| 2020/0403136 A1 | 12/2020 | Adachi et al. | |
| 2021/0036202 A1* | 2/2021 | Hara | H10N 10/01 |

FOREIGN PATENT DOCUMENTS

| | | | | |
|---|---|---|---|---|
| JP | 2003258323 A | | 9/2003 | |
| JP | 2016207995 A | | 12/2016 | |
| JP | 2019500757 A | | 1/2019 | |
| KR | 20160028697 A | * | 3/2016 | ............ H10N 10/01 |
| WO | WO-2015046253 A1 | | 4/2015 | |
| WO | WO-2016103784 A1 | | 6/2016 | |
| WO | WO-2017074003 A1 | | 5/2017 | |
| WO | WO-2018139475 A1 | | 8/2018 | |
| WO | WO-2018179544 A1 | * | 10/2018 | ............ H01L 35/02 |
| WO | WO-2019171915 A1 | | 9/2019 | |

OTHER PUBLICATIONS

Office Action issued Mar. 12, 2024 in corresponding Japanese Patent Application No. 2022-559215 (with English translation), 9 pages.
International Search Report issued Jan. 25, 2022 in PCT/JP2021/039750 (with English translation), 5 pages.
Written Opinion issued Jan. 25, 2022 in PCT/JP2021/039750 (with English translation), 8 pages.
Office Action issued Oct. 10, 2023 in Japanese Patent Application No. 2022-559215 with English translation, 7 pages.
Office Action issued Apr. 1, 2025, in corresponding Japanese Patent Applicaiton No. 2022-559215 (with English translation), 10 pages.

* cited by examiner

THERMOELECTRIC CONVERSION MODULE

TECHNICAL FIELD

The present invention relates to a thermoelectric conversion module.

BACKGROUND ART

Typically, one means for effectively utilizing energy is a device that directly inter-converts thermal energy and electrical energy using a thermoelectric conversion module having a thermoelectric effect such as a Seebeck effect or a Peltier effect.

As such a thermoelectric conversion module, usage of a so-called π-type thermoelectric conversion element is known. The π-type thermoelectric conversion element is configured with a basic unit in which a pair of electrodes spaced apart from each other are provided on a substrate, for example, a lower surface of a P-type thermoelectric element is provided on one electrode and a lower surface of an N-type thermoelectric element is provided on the other electrode, with the lower surfaces being spaced apart from each other, and upper surfaces of both-type thermoelectric elements are connected to the electrodes on opposing substrates. A plurality of such basic units are typically provided to achieve electrically serial connection and thermally parallel connection in both substrates. In addition, the use of a so-called uni-leg-type thermoelectric conversion element is also known. In the configuration of the π-type thermoelectric conversion element described above, the uni-leg-type thermoelectric conversion element is configured only with a P-type thermoelectric element or an N-type thermoelectric element, and is configured such that upper and lower surfaces of adjacent thermoelectric elements are electrically connected in series using a conductive member or the like.

In recent years, to put a product or the like using a thermoelectric conversion module including such a π-type thermoelectric conversion element or the like into practical use, there have been various demands for thinning of the thermoelectric conversion module, reduction in materials, improvement of productivity, improvement of reliability, and the like. For example, Patent Document 1 and Patent Document 2 disclose thermoelectric conversion modules using the above-described π-type thermoelectric conversion elements.

CITATION LIST

Patent Literature

Patent Document 1: JP 2001-102643 A
Patent Document 2: WO 2017/074003

SUMMARY OF INVENTION

Technical Problem

However, the thermoelectric conversion module described in Patent Document 1 is constituted by a P-type element formed from a P-type thermoelectric material, an N-type element formed from an N-type thermoelectric material, two substrates having metal electrodes capable of forming a PN junction pair by joining each pair of these different types of elements, and the like, and since a base material for supporting at least the metal electrodes and the elements is used, the thinning of the thermoelectric conversion module, reduction in constituting materials, and the like are not taken into account at all. Similarly, in the thermoelectric conversion module of Patent Document 2, although a base material serving as a support is not included in the final configuration, a contact heat conductive layer is provided at a position where a substrate is typically disposed, and since the contact heat conductive layer is formed from aluminum nitride, silicon nitride, alumina, or the like, which is of the same kind as a typical base material, and also functions as a support, the thinning of the thermoelectric conversion module, reduction in constituting materials, and the like are substantially not taken into account.

The present invention has been made in view of such circumstances, and an object thereof is to provide a thin thermoelectric conversion module that has no support base material.

Solution to Problem

As a result of earnest study to solve the problems described above, the inventors of the present invention have found that a self-standing thin thermoelectric conversion module that does not require any support base material, which has high thermal resistance as a known support, can be obtained by directly disposing electrodes on both surfaces of a self-standing integrated body including an insulator configured to fill a gap between a chip of a P-type thermoelectric conversion material and a chip of an N-type thermoelectric conversion material, the chips being alternately arranged and spaced apart from each other, or between a chip of a P-type thermoelectric conversion material or a chip of an N-type thermoelectric conversion material and a conductive chip, the chips being alternately arranged and spaced apart from each other, and have completed the present invention.

That is, the present invention provides the following [1] to [12].

[1] A thermoelectric conversion module including: an integrated body including an insulator configured to fill a gap defined by a chip of a P-type thermoelectric conversion material and a chip of an N-type thermoelectric conversion material, the chips being alternately arranged and spaced apart from each other; a common first electrode provided on one surface of the integrated body and joining one surface of the chip of the P-type thermoelectric conversion material and one surface of the chip of the N-type thermoelectric conversion material; and a common second electrode provided on another surface of the integrated body, facing the first electrode, and joining another surface of the chip of the N-type thermoelectric conversion material and another surface of the chip of the P-type thermoelectric conversion material, in which the first electrode and the second electrode provide electrically serial connection between the chip of the P-type thermoelectric conversion material and the chip of the N-type thermoelectric conversion material, and both surfaces of the thermoelectric conversion module are provided with no support base material.

[2] A thermoelectric conversion module including: an integrated body including an insulator configured to fill a gap defined by a chip of a thermoelectric conversion material and a conductive chip, the chips being alternately arranged and spaced apart from each other; a common first electrode provided on one surface of the integrated body and joining one surface of the chip of the thermoelectric conversion material and one surface of the conductive chip; and a common second electrode provided on another surface of the integrated body, facing the first electrode, and joining another surface of the chip of the thermoelectric conversion material and another surface of the conductive chip, in which the first electrode and the second electrode provide electrically serial connection between the chip of the thermoelectric conversion material and the conductive chip, and the chip of the thermoelectric conversion material is selected from a chip of a P-type thermoelectric conversion material or a chip of an N-type thermoelectric conversion material, and both surfaces of the thermoelectric conversion module are provided with no support base material.

[3] The thermoelectric conversion module according to [1] or [2] described above, in which a hardenable pressure sensitive adhesion agent layer is provided on at least one surface of the thermoelectric conversion module.

[4] The thermoelectric conversion module according to any of [1] to [3] described above, in which a release sheet is layered on the hardenable pressure sensitive adhesion agent layer.

[5] The thermoelectric conversion module according to [1] or [2] described above, in which the first electrode and the second electrode are each independently formed from at least one film selected from the group consisting of a vapor deposition film, a plated film, a conductive composition, and a metal foil.

[6] The thermoelectric conversion module according to any of [1] to [5] described above, in which the insulator is selected from an insulating resin and ceramic.

[7] The thermoelectric conversion module according to [6] described above, in which the insulating resin is selected from a polyimide-based resin, a silicone-based resin, a rubber-based resin, an acrylic resin, an olefin-based resin, a maleimide-based resin, and an epoxy-based resin.

[8] The thermoelectric conversion module according to any of [1] to [7] described above, in which the chip of the P-type thermoelectric conversion material and the chip of the N-type thermoelectric conversion material are formed from a thermoelectric semiconductor composition.

[9] The thermoelectric conversion module according to [8] described above, in which the thermoelectric semiconductor composition includes a thermoelectric semiconductor material, a resin, and one or both of an ionic liquid and an inorganic ionic compound.

[10] The thermoelectric conversion module according to [2] described above, in which a material of the conductive chip is selected from copper, gold, silver, platinum, nickel, a copper alloy, aluminum, and constantan.

[11] The thermoelectric conversion module according to [3] described above, in which a hard member is further provided on the hardenable pressure sensitive adhesion agent layer provided on at least one surface of the thermoelectric conversion module.

[12] The thermoelectric conversion module according to [11] described above, in which the hard member is a heat dissipation member.

Advantageous Effects of Invention

The present invention can provide a thin thermoelectric conversion module that has no support base material and is suitable for a narrow space.

DESCRIPTION OF EMBODIMENTS

Thermoelectric Conversion Module

Figure 1:
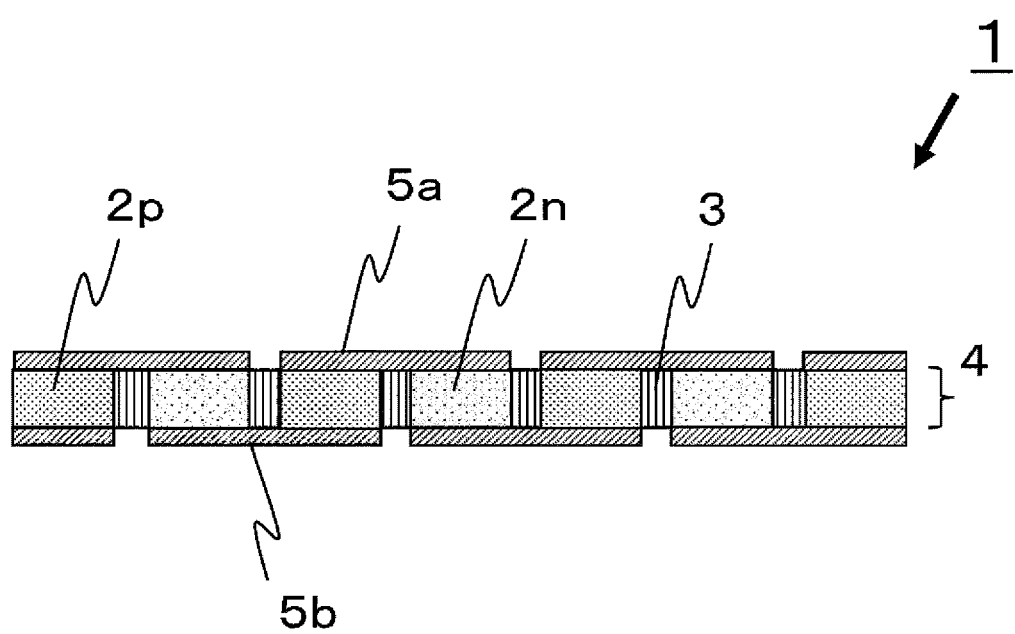
FIG. 1 is a cross-sectional configuration diagram illustrating a first embodiment of a thermoelectric conversion module according to the present invention.

A thermoelectric conversion module according to the present invention includes: an integrated body including an insulator configured to fill a gap defined by a chip of a P-type thermoelectric conversion material and a chip of an N-type thermoelectric conversion material, the chips being alternately arranged and spaced apart from each other; a common first electrode provided on one surface of the integrated body and joining one surface of the chip of the P-type thermoelectric conversion material and one surface of the chip of the N-type thermoelectric conversion material; and a common second electrode provided on another surface of the integrated body, facing the first electrode, and joining another surface of the chip of the N-type thermoelectric conversion material and another surface of the chip of the P-type thermoelectric conversion material, in which the first electrode and the second electrode provide electrically serial connection between the chip of the P-type thermoelectric conversion material and the chip of the N-type thermoelectric conversion material, and both surfaces of the thermoelectric conversion module are provided with no support base material.

The thermoelectric conversion module according to the present invention can eliminate the need for a support base material by directly disposing predetermined electrodes on both surfaces of a self-standing integrated body including the chip of the P-type thermoelectric conversion material, the chip of the N-type thermoelectric conversion material, and the insulator, which constitute the thermoelectric conversion module. Thus, the thinning of the thermoelectric conversion module can be achieved.

In the present specification, the "support base material" means a substrate material used as a support for thermoelectric conversion materials, electrodes, or the like, and is not particularly limited, and examples thereof include glass, silicon, ceramic, resins, and the like, which are commonly used in the thermoelectric field.

Another thermoelectric conversion module according to the present invention includes: an integrated body including an insulator configured to fill a gap defined by a chip of a thermoelectric conversion material and a conductive chip, the chips being alternately arranged and spaced apart from each other; a common first electrode provided on one surface of the integrated body and joining one surface of the chip of the thermoelectric conversion material and one surface of the conductive chip; and a common second electrode provided on another surface of the integrated body, facing the first electrode, and joining another surface of the chip of the thermoelectric conversion material and another surface of the conductive chip, in which the first electrode and the second electrode provide electrically serial connection between the chip of the thermoelectric conversion material and the conductive chip, and the chip of the thermoelectric conversion material is selected from a chip of a P-type thermoelectric conversion material or a chip of an N-type thermoelectric conversion material, and both surfaces of the thermoelectric conversion module are provided with no support base material.

Another thermoelectric conversion module according to the present invention can eliminate the need for a support base material by disposing predetermined electrodes on both surfaces of a self-standing integrated body including the chip of the P-type thermoelectric conversion material or the chip of the N-type thermoelectric conversion material, the conductive chip, and the insulator, which constitute the thermoelectric conversion module. Thus, the thinning of the thermoelectric conversion module can be achieved.

FIG. 1 is a cross-sectional configuration diagram illustrating a first embodiment (basic configuration) of a thermoelectric conversion module according to the present invention. A thermoelectric conversion module 1 includes an integrated body 4 including an insulator 3 configured to fill a gap between a chip 2p of a P-type thermoelectric conversion material and a chip 2n of an N-type thermoelectric conversion material, the chips being alternately arranged and spaced apart from each other; a common first electrode 5a provided on one surface of the integrated body 4 and joining one surface of the chip 2p of the P-type thermoelectric conversion material and one surface of the chip 2n of the N-type thermoelectric conversion material; and a common second electrode 5b provided on another surface of the integrated body 4, facing the first electrode 5a, and joining another surface of the chip 2n of the N-type thermoelectric conversion material and another surface of the chip 2p of the P-type thermoelectric conversion material. The first electrode 5a and the second electrode 5b provide electrically serial connection between the chip 2p of the P-type thermoelectric conversion material and the chip 2n of the N-type thermoelectric conversion material. In the present embodiment, no solder material used for joining support base materials and electrodes is included.

Figure 2:
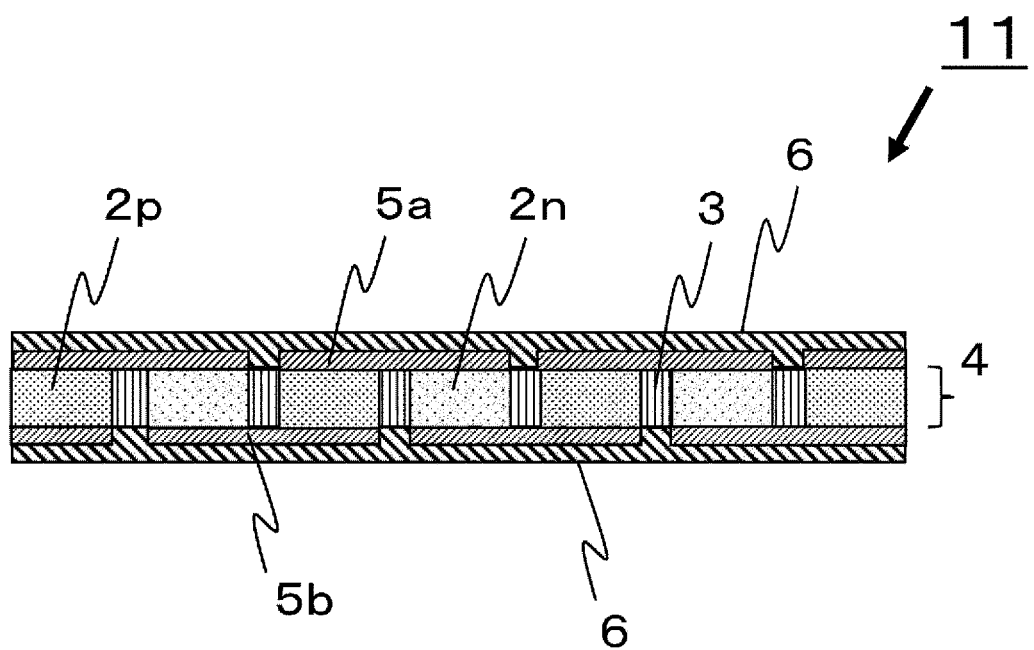
FIG. 2 is a cross-sectional configuration diagram illustrating a second embodiment of a thermoelectric conversion module according to the present invention.

FIG. 2 is a cross-sectional configuration diagram illustrating a second embodiment of a thermoelectric conversion module according to the present invention. A thermoelectric conversion module 11 has a configuration in which a hardenable pressure sensitive adhesion agent layer 6 is provided on both the first electrode 5a and the second electrode 5b in the configuration of FIG. 1. Also in the present embodiment, no solder material used for joining support base materials and electrodes is included.

Figure 3:
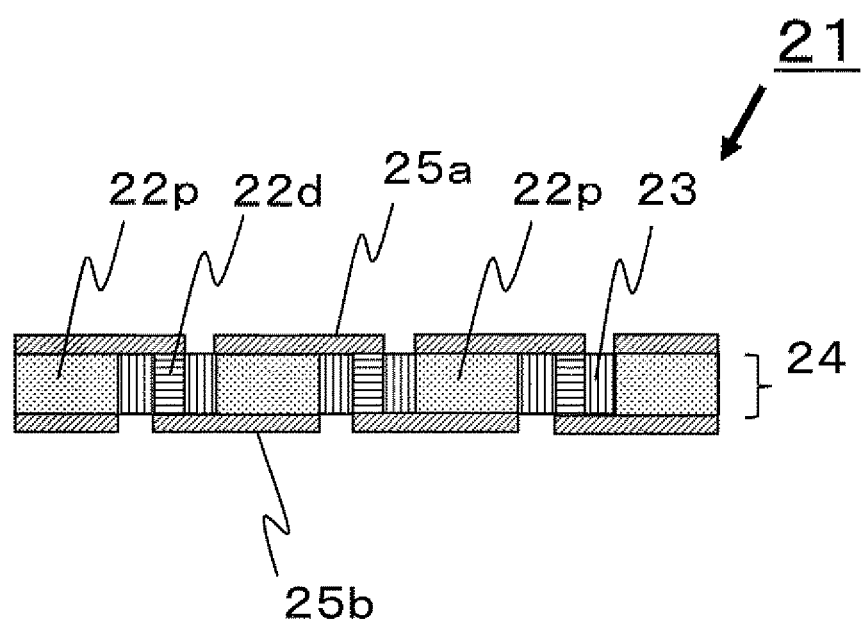
FIG. 3 is a cross-sectional configuration diagram illustrating a third embodiment of a thermoelectric conversion module according to the present invention.

FIG. 3 is a cross-sectional configuration diagram illustrating a third embodiment (basic configuration) of a thermoelectric conversion module according to the present invention. A thermoelectric conversion module 21 includes an integrated body 24 including an insulator 23 configured to fill a gap between a chip 22p of a P-type thermoelectric conversion material and a conductive chip 22d, the chips being alternately arranged and spaced apart from each other; a common first electrode 25a provided on one surface of the integrated body 24 and joining one surface of the chip 22p of the P-type thermoelectric conversion material and one surface of the conductive chip 22d; and a common second electrode 25b provided on another surface of the integrated body 24, facing the first electrode 25a, and joining another surface of the conductive chip 22d and another surface of the chip 22p of the P-type thermoelectric conversion material. The first electrode 25a and the second electrode 25b provide electrically serial connection between the chip 22p of the P-type thermoelectric conversion material and the conductive chip 22d. In the present embodiment, no solder material used for joining support base materials and electrodes is included.

Figure 4:
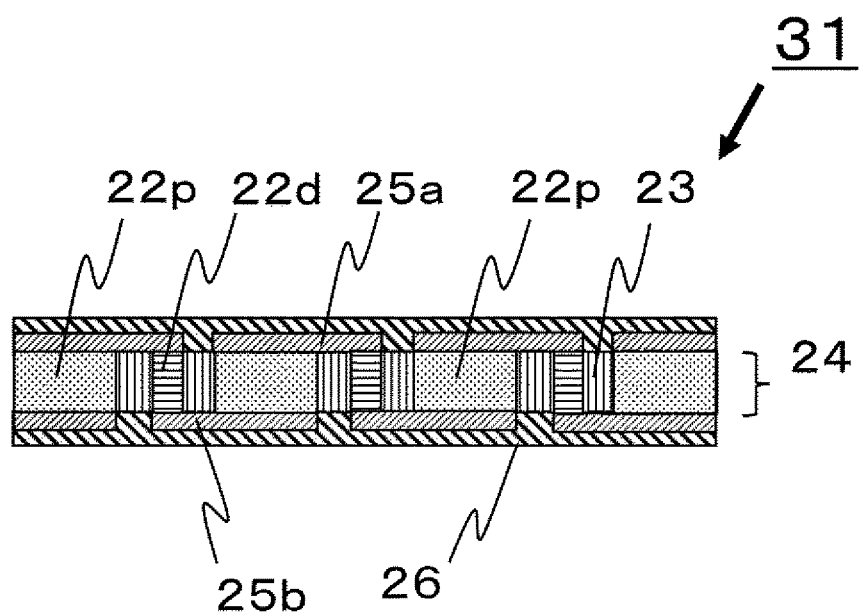
FIG. 4 is a cross-sectional configuration diagram illustrating a fourth embodiment of a thermoelectric conversion module according to the present invention.

FIG. 4 is a cross-sectional configuration diagram illustrating a fourth embodiment of a thermoelectric conversion module according to the present invention. A thermoelectric conversion module 31 has a configuration in which a hardenable pressure sensitive adhesion agent layer 26 is provided on both the first electrode 25a and the second electrode 25b in the configuration of FIG. 3. Also in the present embodiment, no solder material used for joining support base materials and electrodes is included.

Figure 5:
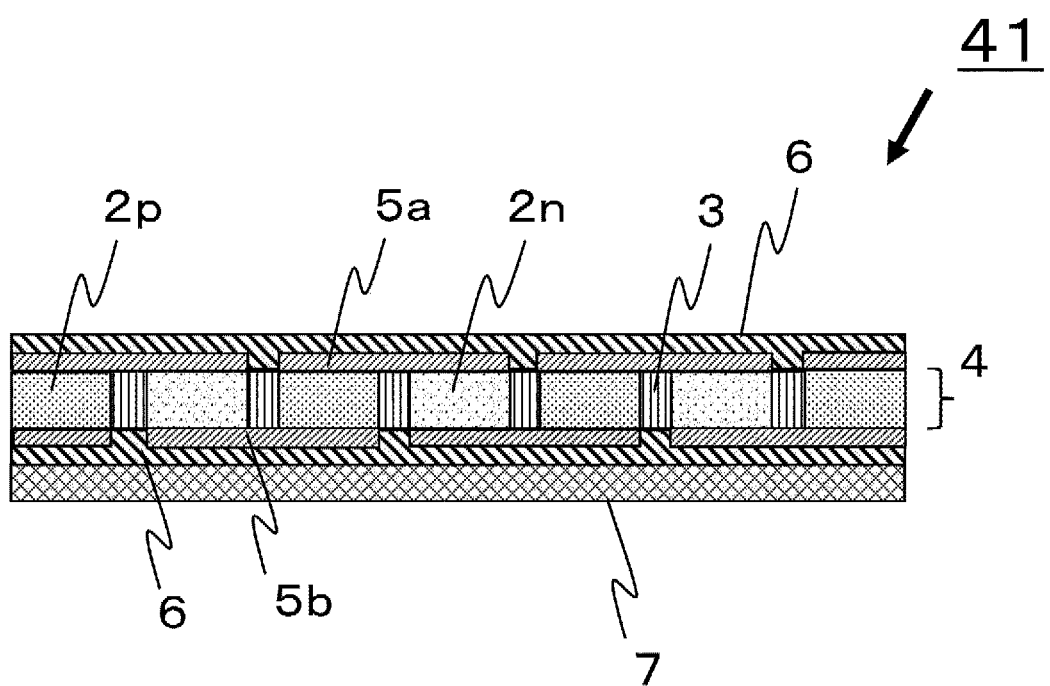
FIG. 5 is a cross-sectional configuration diagram illustrating a fifth embodiment of a thermoelectric conversion module according to the present invention.

FIG. 5 is a cross-sectional configuration diagram illustrating a fifth embodiment of a thermoelectric conversion module according to the present invention. A thermoelectric conversion module 41 has a configuration in which a hard member 7 is provided on a surface of the hardenable pressure sensitive adhesion agent layer 6 on the surface of the second electrode 5b in the configuration of FIG. 2. Also in the present embodiment, no solder material used for joining support base materials and electrodes is included.

Figure 6:
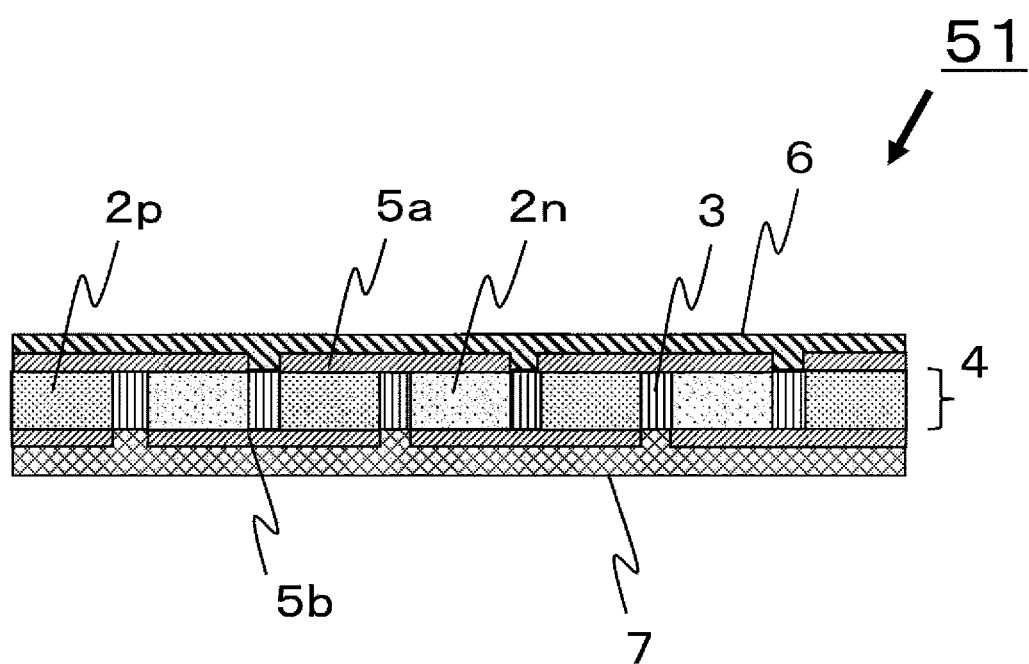
FIG. 6 is a cross-sectional configuration diagram illustrating a sixth embodiment of a thermoelectric conversion module according to the present invention.

FIG. 6 is a cross-sectional configuration diagram illustrating a sixth embodiment of a thermoelectric conversion module according to the present invention. A thermoelectric conversion module 51 has a configuration in which a hard member 7 is provided instead of the hardenable pressure sensitive adhesion agent layer 6 on the surface of the second electrode 5b in the configuration of FIG. 2. Also in the present embodiment, no solder material used for joining support base materials and electrodes is included.

Chip of Thermoelectric Conversion Material

The chip of the thermoelectric conversion material used in the present invention is not particularly limited, and may be formed from a thermoelectric semiconductor material or may be a thin film formed from a thermoelectric semiconductor composition.

From the perspectives of flexibility, thin profile, and thermoelectric performance, the chip is preferably formed from a thin film formed from a thermoelectric semiconductor composition containing a thermoelectric semiconductor material (hereinafter, also referred to as "thermoelectric semiconductor particles"), a resin, and one or both of an ionic liquid and an inorganic ionic compound.

In the present specification, "thermoelectric conversion material" is synonymous with "chip of a thermoelectric conversion material" and with "thermoelectric conversion material layer".

Thermoelectric Semiconductor Material

The thermoelectric semiconductor material used in the chip of the thermoelectric conversion material is, for example, preferably pulverized to a predetermined size by a micropulverizer or the like and used as thermoelectric semiconductor particles (hereinafter, the thermoelectric semiconductor material may be referred to as "thermoelectric semiconductor particles").

A particle size of the thermoelectric semiconductor particles is preferably from 10 nm to 100 μm, more preferably from 20 nm to 50 μm, and even more preferably from 30 nm to 30 μm.

An average particle size of the thermoelectric semiconductor particles was obtained by measurement using a laser diffraction particle size analyzer (Mastersizer 3000 available from Malvern Panalytical Ltd.), and used as the median of the particle size distribution.

In the chip of the thermoelectric conversion material used in the present invention, the thermoelectric semiconductor material constituting the chip of the P-type thermoelectric conversion material and the chip of the N-type conversion material is not particularly limited as long as the material is capable of generating a thermo-electromotive force by imparting a temperature difference. Examples of such thermoelectric semiconductor materials that can be used include bismuth-tellurium-based thermoelectric semiconductor materials such as a P-type bismuth telluride, and an N-type bismuth telluride; telluride-based thermoelectric semiconductor materials such as GeTe and PbTe; antimony-tellurium-based thermoelectric semiconductor materials; zinc-antimony-based thermoelectric semiconductor materials such as ZnSb, $Zn_3Sb_2$, and $Zn_4Sb_3$; silicon-germanium-based thermoelectric semiconductor materials such as SiGe; bismuth selenide-based thermoelectric semiconductor materials such as $Bi_2Se_3$; silicide-based thermoelectric semiconductor materials such as $\beta$-$FeSi_2$, $CrSi_2$, $MnSi_{1.73}$, and $Mg_2Si$; oxide-based thermoelectric semiconductor materials; Heusler materials such as FeVAl, FeVAlSi, and FeVTiAl; and sulfide-based thermoelectric semiconductor materials such as $TiS_2$.

Among these materials, the thermoelectric semiconductor material used in the present invention is preferably a bismuth-tellurium-based thermoelectric semiconductor materials such as P-type bismuth telluride or N-type bismuth telluride.

The P-type bismuth telluride is preferably one for which the carrier is a positive hole and the Seebeck coefficient is a positive value, and for example, a P-type bismuth telluride represented by $Bi_XTe_3Sb_{2-X}$ is preferably used. In this case, X is preferably $0<X\leq0.8$, and more preferably $0.4\leq X\leq0.6$. X of greater than 0 and 0.8 or less is preferred because the Seebeck coefficient and electrical conductivity become large, and characteristics as the P-type thermoelectric conversion material are maintained.

In addition, the N-type bismuth telluride is preferably one for which the carrier is an electron and the Seebeck coefficient is a negative value, and, for example, an N-type bismuth telluride represented by $Bi_2Te_{3-Y}Se_Y$ is preferably used. In this case, Y is preferably $0\leq Y\leq3$ (when Y=0, $Bi_2Te_3$), and more preferably $0.1<Y\leq2.7$. Y of 0 or greater and 3 or less is preferred because the Seebeck coefficient and electrical conductivity become large, and characteristics as the N-type thermoelectric conversion material are maintained.

The content of the thermoelectric semiconductor particles in the thermoelectric semiconductor composition is preferably from 30 to 99 mass %. More preferably, the content is from 50 to 96 mass %, and even more preferably from 70 to 95 mass %. If the content of the thermoelectric semiconductor particles is within the range described above, the Seebeck coefficient (absolute value of the Peltier coefficient) is large, a decrease in electrical conductivity is suppressed, and only thermal conductivity is reduced, and therefore a film exhibiting a high thermoelectric performance and having sufficient film strength and flexibility is obtained. Thus, the content of the thermoelectric semiconductor particles is preferably within the range described above.

Furthermore, the thermoelectric semiconductor particles are preferably subjected to an annealing treatment (hereinafter, also referred to as an "annealing treatment A"). When the thermoelectric semiconductor particles are subjected to the annealing treatment A, the crystallinity of the thermoelectric semiconductor particles is improved, and a surface oxide film of the thermoelectric semiconductor particles is removed, and therefore the Seebeck coefficient (absolute value of the Peltier coefficient) of the thermoelectric conversion material increases, and the thermoelectric performance index can be further improved.

Resin

The resin used in the present invention has a function of physically bonding the thermoelectric semiconductor material (thermoelectric semiconductor particles) together, and can increase the flexibility of the thermoelectric conversion module and facilitate the formation of a thin film through coating or the like.

The resin is preferably a heat-resistant resin or a binder resin.

When crystal growth of the thermoelectric semiconductor particles is caused by subjecting the thin film formed from the thermoelectric semiconductor composition to an annealing treatment or the like, the physical properties such as mechanical strength and thermal conductivity of the heat-resistant resin as a resin are maintained without being impaired.

From the perspective of further increasing heat resistance and not adversely affecting crystal growth of the thermoelectric semiconductor particles in the thin film, the heat-resistant resin is preferably a polyamide resin, a polyamide-imide resin, a polyimide resin, or an epoxy resin, and from the perspective of excelling in flexibility, the heat-resistant resin is more preferably a polyamide resin, a polyamide-imide resin, or a polyimide resin.

The heat-resistant resin preferably has a decomposition temperature of 300° C. or higher. If the decomposition temperature is within the range described above, flexibility can be maintained without loss of function as a binder even when the thin film formed from the thermoelectric semiconductor composition is subjected to annealing treatment as described below.

In addition, the heat-resistant resin preferably has a mass loss rate at 300° C. of not greater than 10%, more preferably not greater than 5%, and even more preferably not greater than 1%, as measured through thermogravimetry (TG). If the mass loss rate is within the range described above, even if the thin film made from the thermoelectric semiconductor composition is subjected to annealing treatment, flexibility of the chip of the thermoelectric conversion material can be maintained without loss of function as a binder.

The content of the heat-resistant resin in the thermoelectric semiconductor composition is from 0.1 to 40 mass %, preferably from 0.5 to 20 mass %, more preferably from 1 to 20 mass %, and even more preferably from 2 to 15 mass %. When the content of the heat-resistant resin is within the range described above, the heat-resistant resin functions as a binder of the thermoelectric semiconductor material and facilitates the formation of a thin film, a film having both high thermoelectric performance and film strength is obtained, and a resin portion is present on an outer surface of the chip of the thermoelectric conversion material.

The binder resin also facilitates peeling from a base material of glass, alumina, silicon, or the like after a firing (annealing) treatment (corresponding to the "annealing treatment B" described below, same hereinafter), the base material being used when fabricating a chip of a thermoelectric conversion material.

The binder resin is preferably a resin for which 90 mass % or greater decomposes at the firing (annealing) temperature or higher, is more preferably a resin for which 95 mass % or greater decomposes at the firing temperature or higher, and is particularly preferably a resin for which 99 mass % or greater decomposes at the firing temperature or higher. In addition, the binder resin is more preferably a resin of which various physical properties such as mechanical strength and thermal conductivity are maintained without being impaired when crystal growth of the thermoelectric semiconductor particles is caused by subjecting a coating film (thin film) including the thermoelectric semiconductor composition to a firing (annealing) treatment or the like.

When a resin for which 90 mass % or greater decomposes at the firing (annealing) temperature or higher, that is, a resin that decomposes at a lower temperature than the heat-resistant resin described above, is used as the binder resin, the binder resin decomposes through firing, and therefore the content of the binder resin serving as an insulating component contained in the fired product is reduced, and crystal growth of the thermoelectric semiconductor particles in the thermoelectric semiconductor composition is promoted. Thus, voids in the thermoelectric conversion material layer can be reduced, and the filling ratio can be improved.

Note that whether a resin decomposes at or above a predetermined amount (for example, 90 mass %) at or above the firing (annealing) temperature is determined by measuring the mass loss rate (a value obtained by dividing the mass after decomposition by the mass before decomposition) at the firing (annealing) temperature through thermogravimetry (TG).

A thermoplastic resin or a curable resin can be used as the binder resin. Examples of thermoplastic resins include polyolefin resins such as polyethylene, polypropylene, polyisobutylene, and polymethylpentene; polycarbonates; thermoplastic polyester resins such as polyethylene terephthalate and polyethylene naphthalate; polyvinyl polymers such as polystyrene, acrylonitrile-styrene copolymers, poly(vinylacetate), ethylene-vinyl acetate copolymers, vinyl chloride, poly(vinyl pyridine), poly(vinyl alcohol), and poly(vinyl pyrrolidone); polyurethanes; and cellulose derivatives such as ethyl cellulose. Examples of the curable resin include thermosetting resins and photocurable resins. Examples of thermosetting resins include epoxy resins and phenol resins. Examples of photocurable resins include photocurable acrylic resins, photocurable urethane resins, and photocurable epoxy resins. One of these may be used alone, or two or more may be used in combination.

Among these, from the perspective of electrical resistivity of the thermoelectric conversion material in the thermoelectric conversion material layer, a thermoplastic resin is preferable, a polycarbonate or a cellulose derivative such as ethyl cellulose is more preferable, and a polycarbonate is particularly preferable.

The binder resin is appropriately selected according to the temperature of the firing (annealing) treatment of the thermoelectric semiconductor material in the firing (annealing) treatment process. From the perspective of electrical resistivity of the thermoelectric conversion material in the thermoelectric conversion material layer, the firing (annealing) treatment is preferably implemented at a temperature equal to or higher than the final decomposition temperature of the binder resin.

In the present specification, the "final decomposition temperature" refers to a temperature at which the mass loss rate at the firing (annealing) temperature as determined through thermogravimetry (TG) is 100% (mass after decomposition is 0% of the mass before decomposition).

The final decomposition temperature of the binder resin is typically from 150 to 600° C., preferably from 200 to 560° C., more preferably from 220 to 460° C., and particularly preferably from 240 to 360° C. When a binder resin having a final decomposition temperature within this range is used, the binder resin functions as a binder for the thermoelectric semiconductor material, and formation of a thin film is facilitated when printing.

The content of the binder resin in the thermoelectric semiconductor composition is from 0.1 to 40 mass %, preferably from 0.5 to 20 mass %, more preferably from 0.5 to mass %, and particularly preferably from 0.5 to 5 mass %. When the content of the binder resin is within the range described above, the electrical resistivity of the thermoelectric conversion material in the thermoelectric conversion material layer can be reduced.

The content of the binder resin in the thermoelectric conversion material is preferably from 0 to 10 mass %, more preferably from 0 to 5 mass %, and particularly preferably from 0 to 1 mass %. If the content of the binder resin in the thermoelectric conversion material is within the range described above, the electrical resistivity of the thermoelectric conversion material in the thermoelectric conversion material layer can be reduced.

Ionic Liquid

The ionic liquid that may be contained in the thermoelectric semiconductor composition is a molten salt obtained by combining a cation and an anion and means a salt that can be present as a liquid in any temperature region in −50° C. or higher and lower than 400° C. In other words, the ionic liquid is an ionic compound having a melting point in the range of −50° C. or higher and lower than 400° C. The melting point of the ionic liquid is preferably −25° C. or higher and 200° C. or lower, and more preferably 0° C. or higher and 150° C. or lower. Because the ionic liquid has characteristics such as having a significantly low vapor pressure and being nonvolatile, having excellent thermal stability and electrochemical stability, having a low viscosity, and having a high ionic conductivity, the ionic liquid can effectively suppress reduction of the electrical conductivity between the thermoelectric semiconductor materials as a conductivity aid. Furthermore, because the ionic liquid exhibits high polarity based on the aprotic ionic structure and excellent compatibility with the heat-resistant resin is achieved, the electrical conductivity of the thermoelectric conversion material can be made uniform.

As the ionic liquid, a known or commercially available ionic liquid can be used. Examples thereof include those formed from nitrogen-containing cyclic cation compounds and derivatives thereof, such as pyridinium, pyrimidinium, pyrazolium, pyrrolidinium, piperidinium, and imidazolium; tetraalkylammonium-based amine cations and derivatives thereof; phosphine cations and derivatives thereof, such as phosphonium, trialkylsulfonium, and tetraalkylphosphonium; cation components, such as lithium cation and derivatives thereof; and anion components, such as $Cl^-$, $Br^-$, $I^-$, $AlCl_4^-$, $Al_2Cl_7^-$, $BF_4^-$, $PF_6^-$, $ClO_4^-$, $NO_3^-$, $CH_3COO^-$, $CF_3COO^-$, $CH_3SO_3^-$, $CF_3SO_3^-$, $(FSO_2)_2N^-$, $(CF_3SO_2)_2N^-$, $(CF_3SO_2)_3C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2)N^-$, $C_3F_7COO^-$, and $(CF_3SO_2)(CF_3CO)N^-$.

In the ionic liquid described above, from the perspective of high temperature stability, compatibility between the thermoelectric semiconductor material and the resin, suppression of reduction of the electrical conductivity between the thermoelectric semiconductor materials, and the like, the cation component of the ionic liquid preferably contains at least one type selected from the group consisting of pyridinium cations and derivatives thereof and imidazolium cations and derivatives thereof.

In ionic liquids containing pyridinium cations and derivatives thereof, the cation component is preferably 1-butyl-4-methylpyridinium bromide, 1-butylpyridinium bromide, or 1-butyl-4-methylpyridinium hexafluorophosphate.

In ionic liquids containing imidazolium cations and derivatives thereof, the cation component is preferably [1-butyl-3-(2-hydroxyethyl)imidazolium bromide] or [1-butyl-3-(2-hydroxyethyl)imidazolium tetrafluoroborate].

Furthermore, the ionic liquid described above preferably has a decomposition temperature of 300° C. or higher. When the decomposition temperature is in the range described above, as described below, even in a case where a thin film formed from the thermoelectric semiconductor composition is subjected to annealing treatment, effect as the conductivity aid can be maintained.

The content of the ionic liquid in the thermoelectric semiconductor composition is preferably from 0.01 to 50 mass %, more preferably from 0.5 to 30 mass %, and even more preferably from 1.0 to 20 mass %. When the content of the ionic liquid is in the range described above, reduction of the electrical conductivity is effectively suppressed, and a film having a high thermoelectric performance can be obtained.

Inorganic Ionic Compound

The inorganic ionic compound that may be contained in the thermoelectric semiconductor composition is a compound formed from at least a cation and an anion. Because the inorganic ionic compound is present as a solid in a wide range of a temperature region, which is from 400 to 900° C., and has characteristics such as high ionic conductivity, the inorganic ionic compound can suppress reduction of the electrical conductivity between the thermoelectric semiconductor materials as a conductivity aid.

The content of the inorganic ionic compound in the thermoelectric semiconductor composition is preferably from 0.01 to 50 mass %, more preferably from 0.5 to 30 mass %, and even more preferably from 1.0 to 10 mass %. When the content of the inorganic ionic compound is in the range described above, reduction of the electrical conductivity is effectively suppressed and, as a result, a film having an improved thermoelectric performance can be obtained.

Note that when the inorganic ionic compound and the ionic liquid are used in combination, the total amount of the content of the inorganic ionic compound and the ionic liquid in the thermoelectric semiconductor composition is preferably from 0.01 to 50 mass %, more preferably from 0.5 to 30 mass %, and even more preferably from 1.0 to 10 mass %.

Preparation Method of Thermoelectric Semiconductor Composition

The method for preparing the thermoelectric semiconductor composition is not particularly limited, and the thermoelectric semiconductor composition can be prepared by, for example, adding the thermoelectric semiconductor particles, the ionic liquid, the inorganic ionic compound (when used in combination with the ionic liquid), the heat-resistant resin, and if necessary, the other additives and also a solvent, and mixing and dispersing the various components through a well-known method such as an ultrasonic homogenizer, a spiral mixer, a planetary mixer, a disperser, or a hybrid mixer.

Examples of the solvent include solvents such as toluene, ethyl acetate, methyl ethyl ketone, alcohol, tetrahydrofuran, methyl pyrrolidone, and ethyl cellosolve. One type of these solvents may be used alone, or two or more types of these solvents may be mixed and used. As the solid content concentration of the thermoelectric semiconductor composition, the composition is only required to have a viscosity adequate for application, and the solid content concentration is not particularly limited.

The chip of the thermoelectric conversion material formed from the thermoelectric semiconductor composition is not particularly limited, and, for example, can be formed by obtaining a coating by coating the thermoelectric semiconductor composition onto a base material such as glass, alumina, silicon, or a resin film, or onto a base material on a side on which a below-described sacrificial layer is formed, then drying the coating, and then separating the coating from the base material to obtain the chip of the thermoelectric conversion material as appropriate. By forming in this manner, numerous chips of the thermoelectric conversion material can be easily obtained at a low cost. As the resin film, a film having heat resistance is preferred, and a film formed from a polyamide resin, a polyamide-imide resin, a polyimide resin, or the like is preferable.

The method for coating the thermoelectric semiconductor composition to obtain a chip of a thermoelectric conversion material is not particularly limited, and examples include well-known methods such as screen printing, flexographic printing, gravure printing, spin coating, dip coating, die coating, spray coating, bar coating, and doctor blade coating. When the coating is to be formed in a pattern, a method such as screen printing or slot die coating by which the pattern can be easily formed using a screen plate having the desired pattern is preferably used.

Next, the obtained coating is dried, and thereby a chip of the thermoelectric conversion material is formed. As the drying method, a well-known drying method can be used, such as hot air drying, heated roll drying, and infrared irradiation. The heating temperature is typically from 80 to 150° C., and while the heating time differs depending on the heating method, the heating time is typically from tens of seconds to tens of minutes.

Furthermore, when a solvent is used in the preparation of the thermoelectric semiconductor composition, the heating temperature is not particularly limited as long as the temperature is within a temperature range in which the solvent that is used can be dried.

The thickness of the thin film formed from the thermoelectric semiconductor composition is not particularly limited, but from the perspective of thermoelectric performance and film strength, the thickness of the thin film is preferably from 100 nm to 1000 μm, more preferably from 300 nm to 600 μm, and even more preferably from 5 to 400 μm.

As a thin film made from the thermoelectric semiconductor composition, the chip of the thermoelectric conversion material is preferably further subjected to an annealing treatment (also referred to hereinafter as the "annealing treatment B"). By subjecting the chip to the annealing treatment B, the thermoelectric performance can be stabilized, crystal growth of the thermoelectric semiconductor particles in the thin film can be promoted, and the thermoelectric performance can be further improved. The annealing treatment B is not particularly limited, but is ordinarily implemented in an atmosphere with the gas flow rate controlled, including in an inert gas atmosphere such as nitrogen or argon or in a reducing gas atmosphere, or is implemented under vacuum conditions, and while dependent on factors such as the heat resistance temperatures of the resin and ionic compound that are used, the annealing treatment B is typically implemented at a temperature of from 100 to 500° C. for several minutes to several tens of hours. Furthermore, in the annealing treatment B, the thermoelectric semiconductor composition may be pressed to increase the density of the thermoelectric semiconductor composition.

As the sacrificial layer, a resin such as poly(methyl methacrylate) or polystyrene, or a release agent such as a fluorine-based release agent or a silicone-based release agent can be used. When a sacrificial layer is used, the chip of the thermoelectric conversion material formed on a base material such as glass can easily be peeled from the glass or the like after the annealing treatment B.

The formation of the sacrificial layer is not particularly limited, and the sacrificial layer can be formed by a well-known method such as flexographic printing or spin coating.

Conductive Chip

The conductive chip used in the present invention is used to electrically connect the chip of the P-type thermoelectric conversion material or the chip of the N-type thermoelectric conversion material with a first electrode and a second electrode interposed therebetween.

The conductive chip may be formed from a conductive material described below, or may be a thin film formed from a composition containing the conductive material.

Examples of the conductive material constituting the conductive chip include metal materials such as copper, silver, gold, platinum, nickel, aluminum, constantan, chromium, indium, iron, and copper alloys, indium tin oxide (ITO), zinc oxide (ZnO), and the like. Copper, gold, silver, platinum, nickel, copper alloys, aluminum, and constantan are preferable, and copper, gold, silver, platinum, and nickel are more preferable.

Among these, from the perspective of thermoelectric performance, a material that easily reduces the electrical resistance of the conductive chip and the contact electrical resistance between conductive chips and that increases the thermal resistance is preferably used.

In actual use, these materials allow electricity to easily flow and have small electrical resistance, but have small thermal resistance, and thus tend to cause a large thermal leakage. Thus, for example, it is necessary to optimize the structure including the shape of the conductive chip and to appropriately adjust their balance.

The thickness of the conductive chip is the same as the thickness of the chip of the thermoelectric conversion material, and is preferably from 100 nm to 1000 μm, more preferably from 300 nm to 600 μm, and even more preferably from 5 to 400 μm.

Insulator

The insulator used in the present invention is not particularly limited as long as the insulating property between the chip of the P-type thermoelectric conversion material and the chip of the N-type thermoelectric conversion material, the insulating property between chips of the P-type thermoelectric conversion material or between chips of the N-type thermoelectric conversion material, and the mechanical strength of them formed into an integrated body can be maintained, and examples thereof include an insulating resin and ceramic.

Examples of the insulating resin include a polyimide-based resin, a silicone-based resin, a rubber-based resin, an acrylic resin, an olefin-based resin, a maleimide-based resin, and an epoxy-based resin. From the perspectives of heat resistance and mechanical strength, the resin is preferably selected from a polyimide-based resin, a silicone-based resin, an acrylic resin, a maleimide-based resin, and an epoxy-based resin. The insulating resin is preferably a curable resin or a foamable resin.

The insulating resin may further include a filler. The filler is preferably a hollow filler. The hollow filler is not particularly limited, and a known hollow filler can be used. Examples thereof include inorganic hollow fillers such as glass balloon, silica balloon, shirasu balloon, fly ash balloon, and metal silicate balloon (hollow body), and organic resin hollow fillers such as acrylonitrile, vinylidene chloride, phenol resin, epoxy resin, and urea resin balloon (hollow body). By using the hollow filler, the thermal conductivity of the insulating resin is lowered and the thermoelectric performance is further improved.

Examples of the ceramic include materials containing aluminum oxide (alumina), aluminum nitride, zirconium oxide (zirconia), silicon carbide, or the like as a main component (50 mass % or greater in the ceramic). In addition to the main component, for example, a rare earth compound can be added.

The insulator can be filled by a well-known method. Examples of the method include: as examples of using a liquid resin, a method in which the resin is applied over and filled in a support surface on which chips of the P-type thermoelectric conversion material and chips of the N-type thermoelectric conversion material are alternately arranged using a coating member such as a squeegee, a method in which the resin is dropped from substantially the center to the outer side of the support and then filled by spin coating, and a method in which the support is immersed in a liquid resin reservoir or the like and then pulled up to fill the resin; and as an example using a sheet insulating resin, a method in which the sheet insulating resin is applied onto a support surface on which chips of the P-type thermoelectric conversion material and chips of the N-type thermoelectric conversion material are alternately arranged and the sheet insulating resin is melted and filled by heating and/or pressurization. After filling the insulator, thermal curing or the like is performed.

The support is not particularly limited, and examples thereof include glass, silicon, ceramic, metals, and plastics. Among these, glass, plastic, and silicon are preferably selected. When annealing treatment or the like is performed at a high temperature, glass, silicon, ceramic, and metals are preferable.

The thickness of the support is preferably from 100 to 1200 μm, more preferably from 200 to 800 μm, and even more preferably from 400 to 700 μm from the perspectives of process and dimensional stability.

The support is peeled off after the integrated body is obtained.

Hardenable Pressure Sensitive Adhesion Agent Layer

Preferably, a hardenable pressure sensitive adhesion agent layer is provided on at least one surface of the thermoelectric conversion module. That is, by providing the hardenable pressure sensitive adhesion agent layer on both or one of the first electrode and the second electrode, including the gap between adjacent first electrodes and the gap between adjacent second electrodes, for example, by causing the thermoelectric conversion module to adhere to an adherend such as a heat source or an object to be cooled, the thermoelectric conversion module can be easily installed. Furthermore, by including the gap between the first electrodes and the gap between the second electrodes, the weather resistance can be improved.

The hardenable pressure sensitive adhesion agent layer is not particularly limited, for example, as long as it can easily adhere to an adherend such as a desired heat source or object to be cooled, and only needs to contain an adhesive resin, and may contain, if desired, additives for pressure sensitive adhesives such as a cross-linking agent, a tackifier, a polymerizable compound, and a polymerization initiator, a silane coupling agent, an antistatic agent, an antioxidant, an ultraviolet absorber, a light stabilizer, a softener, a filler, a refractive index adjuster, a colorant, and the like.

Note that in the present specification, "hardenable pressure sensitive adhesive resin" is a concept that includes both a resin having pressure sensitive adhesiveness and a resin having adhesiveness, and includes, for example, not only a resin having hardenable pressure sensitive adhesiveness from the resin itself, but also a resin that exhibits hardenable pressure sensitive adhesiveness through combined use with another component such as an additive, and a resin that exhibits adhesiveness through the presence of a trigger such as heat or water.

Examples of the hardenable pressure sensitive adhesive resin include rubber-based resins such as acrylic resins, urethane-based resins, and polyisobutylene-based resins, polyester-based resins, olefin-based resins, silicone-based resins, and polyvinyl ether-based resins.

The thickness of the hardenable pressure sensitive adhesion agent layer is not particularly limited, but is preferably from 1 to 50 µm, and more preferably from 2 to 30 µm.

The hardenable pressure sensitive adhesion agent layer may be formed directly on the electrodes on the integrated body, from a pressure sensitive adhesive composition containing a pressure sensitive adhesive resin and by a well-known method. Examples of the method for forming the hardenable pressure sensitive adhesion agent layer include a spin coating method, spray coating method, bar coating method, knife coating method, roll coating method, roll knife coating method, blade coating method, die coating method, and gravure coating method.

The hardenable pressure sensitive adhesion agent layer may be covered with a release film. The release film is not particularly limited. For example, from the perspective of ease of handling, the release film preferably includes a release base material and a release agent layer formed by applying a release agent on the release base material. The release film may have a release agent layer only on one side of the release base material, or may have release agent layers on both sides of the release base material. Examples of the release base material include a paper base material, laminated paper obtained by laminating a thermoplastic resin such as polyethylene on the paper base material, and a plastic film. Examples of the paper base material include glassine paper, coated paper, cast-coated paper, and the like. Examples of the plastic film include polyester films such as polyethylene terephthalate, polybutylene terephthalate, and polyethylene naphthalate; and polyolefin films such as polypropylene and polyethylene. Examples of the release agent include olefin-based resins, rubber-based elastomers (for example, butadiene-based resins, isoprene-based resins), long-chain alkyl-based resins, alkyd-based resins, fluorine-based resins, and silicone-based resins.

The thickness of the release film is not particularly limited, but is usually from 20 to 200 µm, and preferably from 25 to 150 µm.

The thickness of the release agent layer is not particularly limited, but when the release agent layer is formed by applying a solution containing a release agent, the thickness of the release agent layer is preferably from 0.01 to 2.0 µm, more preferably from 0.03 to 1.0 µm.

When a plastic film is used as the release base material, the thickness of the plastic film is preferably from 3 to 50 µm, more preferably from 5 to 40 µm.

The hardenable pressure sensitive adhesion agent layer having the release film is produced, for example, through the following steps.

First, a pressure sensitive adhesive composition is applied onto the release film to form a coating. Next, the coating is dried to form the hardenable pressure sensitive adhesion agent layer. Next, the hardenable pressure sensitive adhesion agent layer on the release film and the electrode on the integrated body are bonded to each other to be produced.

Hard Member

Preferably, a hard member is further provided on the hardenable pressure sensitive adhesion agent layer provided on at least one surface of the thermoelectric conversion module.

Preferably, the hardenable pressure sensitive adhesion agent layer is provided on one surface of the thermoelectric conversion module and the hard member is provided on another surface of the thermoelectric conversion module.

The hard member is preferably a heat dissipation member.

By using the heat dissipation member, for example, a temperature difference can be efficiently provided in the thickness direction of the chip of the P-type thermoelectric conversion material and the chip of the N-type conversion material of the thermoelectric conversion module.

When the heat dissipation member is used as the hard member, the electrode, the chips of the thermoelectric conversion materials, and the like are directly layered on the heat dissipation member, which makes it possible to eliminate the need for a support base material.

Examples of the heat dissipation member include metal materials, ceramic materials, or a mixture of these materials and a resin. Among these, at least one material selected from metal materials and ceramic materials is preferable.

Examples of the metal materials include: a single metal such as gold, silver, copper, nickel, tin, iron, chromium, platinum, palladium, rhodium, iridium, ruthenium, osmium, indium, zinc, molybdenum, manganese, titanium, and aluminum; and an alloy containing two or more metals such as stainless steel and brass.

Examples of the ceramic materials include barium titanate, aluminum nitride, boron nitride, aluminum oxide, silicon carbide, and silicon nitride.

Among these, the metal materials are preferred from the perspectives of high thermal conductivity, processability, and flexibility. Among the metal materials, copper (including oxygen-free copper) and stainless steel are preferable, and copper is more preferable because of its higher thermal conductivity and easier processability.

The resin used to be mixed with the metal materials or the ceramic materials is not particularly limited, and examples thereof include polyimide, polyamide, polyamide-imide, polyphenylene ether, polyether ketone, polyether ether ketone, polyolefin, polyester, polycarbonate, polysulfone, polyethersulfone, polyphenylene sulfide, polyarylate, nylon, acrylic resin, cycloolefin polymer, and aromatic polymer.

Typical examples of the metal materials having high thermal conductivity used in the present invention are described below.

Oxygen-Free Copper

Oxygen-free copper (OFC) generally refers to high-purity copper of 99.95% (3N) or greater that does not contain oxides. The Japanese Industrial Standards specifies oxygen-free copper (JIS H 3100, C1020) and oxygen-free copper for electronic tubes (JIS H3510, C1011).

Stainless Steel (JIS)
SUS304: 18Cr-8Ni (containing 18% Cr and 8% Ni)
SUS316: 18Cr-12Ni (stainless steel containing 18% Cr, 12% Ni, and molybdenum (Mo))

The method for forming the hard member used in the present invention is not particularly limited, and examples thereof include a method for processing a sheet hard member to have predetermined dimensions, or a method for processing a hard member into a predetermined pattern shape by a known physical treatment or chemical treatment based on photolithography or by using these treatments in combination in advance.

The thermal conductivity of the heat dissipation member is preferably from 15 to 500 W/(m·K), more preferably from 100 to 450 W/(m·K), and even more preferably from 250 to 420 W/(m·K). When the thermal conductivity of the heat dissipation member is in the above-described range, a temperature difference can be efficiently provided.

The thickness of the heat dissipation member is preferably from 15 to 550 μm, more preferably from 30 to 530 μm, and even more preferably from 70 to 510 μm. When the thickness of the heat dissipation member is in this range, a temperature difference can be efficiently provided in the thickness direction of the chip of the P-type thermoelectric conversion material and the chip of the N-type conversion material.

First Electrode and Second Electrode

The first electrode and the second electrode (hereinafter, sometimes simply referred to as "electrodes") used in the present invention are preferably formed from at least one film selected from the group consisting of a vapor deposition film, a plated film, a conductive composition, and a metal foil.

Metal materials used in the electrodes are not particularly limited, and examples thereof include copper, gold, nickel, aluminum, rhodium, platinum, chromium, palladium, stainless steel, molybdenum, solder, or an alloy containing any of these metals.

Examples of methods for forming the electrodes include a method in which an electrode having no pattern formed thereon is provided on the integrated body described above, and processed into a predetermined pattern shape by a known physical treatment or chemical treatment mainly using a photolithography method or a combination thereof, or a method in which a pattern of an electrode is directly formed by screen printing, an inkjet method, or the like using conductive paste formed from a conductive composition including the metal materials and the like.

Examples of methods for forming an electrode having no pattern formed thereon include dry processes including physical vapor deposition (PVD) methods, such as vacuum vapor deposition, sputtering, and ion plating or chemical vapor deposition (CVD) methods, such as thermal CVD and atomic layer deposition (ALD); or wet processes including various coating methods, such as dip coating, spin coating, spray coating, gravure coating, die coating, and doctor blade coating, and electrodeposition methods; silver salt methods; electrolytic plating; electroless plating; and lamination of metal foils. The method is appropriately selected according to the material for the electrode. The lamination of the metal foils may be joined to a thermoelectric material or the like using solder.

From the perspective of maintaining thermoelectric performance, the electrodes used in the present invention are required to exhibit high electrical conductivity and high thermal conductivity, and therefore use of electrodes formed by a plating method or a vacuum film formation method is more preferable. Since high electrical conductivity and high thermal conductivity can be easily achieved, vacuum film formation methods such as vacuum vapor deposition and sputtering, electrolytic plating, and electroless plating are preferred. A pattern can be easily formed through a hard mask such as a metal mask depending on the dimensions of the pattern to be formed and the required dimensional accuracy.

The thicknesses of the respective layers of the electrodes are preferably from 10 nm to 200 μm, more preferably from 30 nm to 150 μm, and even more preferably from 50 nm to 120 μm. If the thicknesses of the respective layers of the electrodes are within the range described above, electrical conductivity is high, resistance is low, and sufficient strength of an electrode is obtained.

The thermoelectric conversion module according to the present invention does not require a base material serving as a known support, and thus the thermoelectric conversion module can be made thin.

INDUSTRIAL APPLICABILITY

With the thermoelectric conversion module according to the present invention, it is expected that a known thermoelectric conversion module can be made thinner and lighter with higher integration.

REFERENCE SIGNS LIST 1, 11, 21, 31, 41, 51: Thermoelectric conversion module
2p, 22p: Chip of P-type thermoelectric conversion material
2n, 22n: Chip of N-type thermoelectric conversion material
2d: Conductive chip
3, 23: Insulator
4, 24: Integrated body
5a, 25a: First electrode
5b, 25b: Second electrode
6, 26: Hardenable pressure sensitive adhesion agent layer
7: Hard member

The invention claimed is:

1. A T-type thermoelectric conversion module comprising:
an integrated body including an insulator configured to fill a gap defined by a chip of a P-type thermoelectric conversion material and a chip of an N-type thermoelectric conversion material, the chips being alternately arranged and spaced apart from each other;
a common first electrode provided on one surface of the integrated body and joining one surface of the chip of the P-type thermoelectric conversion material and one surface of the chip of the N-type thermoelectric conversion material; and
a common second electrode provided on another surface of the integrated body, facing the first electrode, and joining another surface of the chip of the N-type thermoelectric conversion material and another surface of the chip of the P-type thermoelectric conversion material, wherein:

the first electrode and the second electrode provide electrically serial connection between the chip of the P-type thermoelectric conversion material and the chip of the N-type thermoelectric conversion material, both surfaces of the T-type thermoelectric conversion module are provided with no support base material, and a hardenable pressure sensitive adhesion agent layer which is configured to fill all voids composed of the area between the adjacent first electrodes or the adjacent second electrodes and the insulator is provided on at least one surface of the T-type thermoelectric conversion module.

2. The x-type thermoelectric conversion module according to claim 1, wherein a release sheet is layered on the hardenable pressure sensitive adhesion agent layer.

3. The x-type thermoelectric conversion module according to claim 1, wherein the first electrode and the second electrode are each independently formed from at least one film selected from the group consisting of a vapor deposition film, a plated film, a conductive composition, and a metal foil.

4. The T-type thermoelectric conversion module according to claim 1, wherein the insulator is selected from an insulating resin and ceramic.

5. The x-type thermoelectric conversion module according to claim 4, wherein the insulating resin is selected from a polyimide-based resin, a silicone-based resin, a rubber-based resin, an acrylic resin, an olefin-based resin, a maleimide-based resin, and an epoxy-based resin.

6. The π-type thermoelectric conversion module according to claim 1, wherein the chip of the P-type thermoelectric conversion material and the chip of the N-type thermoelectric conversion material are formed from a thermoelectric semiconductor composition.

7. The x-type thermoelectric conversion module according to claim 6, wherein the thermoelectric semiconductor composition includes a thermoelectric semiconductor material, a resin, and one or both of an ionic liquid and an inorganic ionic compound.

8. The T-type thermoelectric conversion module according to claim 1, wherein a hard member is further provided on the hardenable pressure sensitive adhesion agent layer provided on at least one surface of the T-type thermoelectric conversion module.

9. The T-type thermoelectric conversion module according to claim 8, wherein the hard member is a heat dissipation member.

* * * * *

UNITED STATES PATENT AND TRADEMARK OFFICE
CERTIFICATE OF CORRECTION

PATENT NO. : 12,408,551 B2
APPLICATION NO. : 18/034442
DATED : September 2, 2025
INVENTOR(S) : Yuta Seki et al.

It is certified that error appears in the above-identified patent and that said Letters Patent is hereby corrected as shown below:

In the Claims

In Line 53 in the right column of Claim 1:
"A T-type"
Should read:
-- A π-type --;

In Line 8 in the left column of Claim 1:
"the T-type"
Should read:
-- the π-type --;

In Line 13 in the left column of Claim 1:
"the T-type"
Should read:
-- the π-type --;

In Line 15 in the left column of Claim 2:
"The X-type"
Should read:
-- The π-type --;

In Line 18 in the left column of Claim 3:
"The X-type"
Should read:
-- The π-type --;

Signed and Sealed this
Twenty-fifth Day of November, 2025

John A. Squires
*Director of the United States Patent and Trademark Office*

CERTIFICATE OF CORRECTION (continued)
U.S. Pat. No. 12,408,551 B2

In Line 24 in the left column of Claim 4:
"The T-type"
Should read:
-- The π-type --;

In Line 1 in the right column of Claim 5:
"The x-type"
Should read:
-- The π-type --;

In Line 12 in the right column of Claim 7:
"The x-type"
Should read:
-- The π-type --;

In Line 17 in the right column of Claim 8:
"The T-type"
Should read:
-- The π-type --;

In Line 20 in the right column of Claim 8:
"the T-type"
Should read:
-- the π-type --;

In Line 22 in the right column of Claim 9:
"The T-type"
Should read:
-- The π-type --.